(12) United States Patent  
Hsu

(10) Patent No.: US 8,546,680 B2
(45) Date of Patent: Oct. 1, 2013

(54) ENERGY EFFICIENT MICRO COMBUSTION SYSTEM FOR POWER GENERATION AND FUEL PROCESSING

(76) Inventor: Ying Wen Hsu, San Clemente, CA (US)

( * ) Notice: Subject to any disclaimer, the term of this patent is extended or adjusted under 35 U.S.C. 154(b) by 1534 days.

(21) Appl. No.: 11/482,208

(22) Filed: Jul. 7, 2006

(65) Prior Publication Data

US 2009/0007953 A1 Jan. 8, 2009

Related U.S. Application Data

(60) Provisional application No. 60/697,298, filed on Jul. 8, 2005, provisional application No. 60/698,903, filed on Jul. 14, 2005.

(51) Int. Cl.
*H01L 35/30* (2006.01)

(52) U.S. Cl.
USPC ........... 136/205; 136/200; 136/201; 136/204; 136/211

(58) Field of Classification Search
USPC ................................ 136/205, 200, 21, 24, 211
See application file for complete search history.

(56) References Cited

U.S. PATENT DOCUMENTS

| | | | |
|---|---|---|---|
| 5,988,522 A | 11/1999 | Gelzer et al. | |
| 6,056,204 A | 5/2000 | Glezer et al. | |
| 6,109,222 A | 8/2000 | Glezer et al. | |
| 6,150,601 A * | 11/2000 | Schnatzmeyer et al. | 136/201 |
| 6,193,501 B1 | 2/2001 | Masel et al. | |
| 6,392,313 B1 | 5/2002 | Epstein et al. | |
| 6,397,793 B2 | 6/2002 | Yang et al. | |
| 6,457,654 B1 | 10/2002 | Glezer et al. | |
| 6,513,730 B1 | 2/2003 | Okojie et al. | |
| 6,595,006 B2 | 7/2003 | Thiesen et al. | |
| 6,609,494 B2 * | 8/2003 | Holtman | 123/305 |
| 6,613,972 B2 | 9/2003 | Cohen et al. | |
| 6,755,761 B2 | 6/2004 | Hunnicutt et al. | |
| 6,786,716 B1 | 9/2004 | Gardner et al. | |
| 6,806,624 B2 | 10/2004 | Lee et al. | |
| 6,866,478 B2 | 3/2005 | Fabian et al. | |
| 6,932,030 B2 | 8/2005 | Perlo et al. | |
| 6,939,632 B2 | 9/2005 | Arana et al. | |
| 6,978,611 B1 | 12/2005 | Landis et al. | |

(Continued)

FOREIGN PATENT DOCUMENTS

JP 2004-180488 * 6/2004

OTHER PUBLICATIONS

Mraz, "A pump with no moving parts", Machine Design, Apr. 1, 2004.*

(Continued)

*Primary Examiner* — Xiuyu Tai
(74) *Attorney, Agent, or Firm* — W. Eric Boyd, Esq.

(57) ABSTRACT

An integrated micro-scale power converter converts hydrocarbon fuel into electricity. The integrated micro-scale power converter includes a micromachined combustor adapted to convert hydrocarbon fuel into thermal energy and a micromachined thermoelectric generator adapted to convert the thermal energy into electrical energy. The combustion reaction in the combustor flows in a path in a first plane while the thermal energy flows in a second plane in the generator the second plane being nearly orthogonal or orthogonal to the first plane. The fuel handler in the combustor is adjacent and thermally isolated from the thermoelectric generator. The fuel handler may include a nozzle and gas flow switch, where the frequency of activation of the gas flow switch controls the amount of the fuel ejected from the nozzle.

5 Claims, 5 Drawing Sheets

POWER CHIP (Set)

(56) References Cited

U.S. PATENT DOCUMENTS

| | | | |
|---|---|---|---|
| 6,987,329 B1 | 1/2006 | Smith et al. | |
| 7,180,264 B2* | 2/2007 | Smith et al. | 320/101 |
| 2004/0101750 A1* | 5/2004 | Burch | 429/200 |
| 2005/0135724 A1* | 6/2005 | Helvajian et al. | 385/14 |

OTHER PUBLICATIONS

Fernandez-Pello, A.Carlos, Micro-Power Generation Using Combustion: Issues and Approaches, 29th International Symposium on Combustion, Jul. 21-26, 2002, Sapporo, Japan.

Strasser, M., Aigner, R., Lauterbach, C., Sturn, T. F., Franoseh, M., Wachutka, G., "Micromachined CMOS Thermoelectric Generators As On-Chip Power Supply", Transducers '03, Jun. 8-12, Boston.

Shaevitz, S. B., Franz, A. F., Klavs, F. I., Schmidt M. A., "A Combustion-Based MEMS Thermoelectric Power Generator", Transducers '01, Jun. 10-14, Munich.

Zhang, C., Najafi, K., Bernal, L. P., Washabaugh, P. D., "An Integrated CombustorThermoelectric Micro Power Generator", 11th Conference on Solid State Sensors & Actuators, Jun. 10-14, 2001, Munich, Germany.

Yoshida, K., Kobayashi, K, Nakajima, T., Satoh, D., Tanaka, 5, Esashi, M., "Micro-Thermoelectric Generator Using Catalytic Combustor", Power MEMS 2002, Japan.

Chang, K. S., Tanaka, S., Chang, C. L, Esashi, M., "Combustion Integrated Micro-Fuel Processor with Suspended Membrane Structure", Transducers '03, Jun. 8-12, Boston.

Wijngaards, D. D. L., Kong, S. H., Bartek, M., Wolifenbuttel, F., "Design and Fabrication of on-Chip Integrated PolySiGe and PolySi Peltier Devices," Sensors and Actuators,vol. 85, 2000.

Vican., J, Gajdeczko, B. F., Dryer, F.L, Milius, D.L., Aksay, I.A., Yetter, R.A., "Development of a Microreator as a Thermal Source for MEMS Power Generation", 29th International Symposium on Combustion, Jul. 21-26, 2002, Sapporo, Japan.

Shannon, M., Moore G. V., Ganley 3., Miesse, C. Rice C., Seebauer, E. G., Masel RI, "High-Temperature Microcombustor-Based Ammonia Microehemical Hydrogen Generator Reactors for PEM Fuel Cells", Solid-State Sensors , Actuator and Microsystems Workshop, Hilton Head, 2002.

Nielsen, O.M, Arana, R. A., Baestsch, C.D., Jensen, K.F., Schmidt, M.A.,"A Thermophotovoltaic Micro-Generator for Portable Power Applications", Transducers '03, Boston, 2003.

Norton, D.G.,Voit, K.W., Cruggemann, T., Viachos, D.G., Wetzel, ED., "Portable Power Generation Via Integrated Catalytic Microcombustion-Thermoelectric Device", 2004.

Sitzki, L., Borer, K., Shuster, B., Ronney, P., Wussow, S, "Combustion in Microscale Heat-Recirculating Burners", 3rd Asia-Pacific Conference on Combustion, Seoul, Korea, 2001.

Suzuki, Y., Horii, Y., Kasagi, N., "Micro Catalytic Combustor with Tailored Pt/A1203 Films", 3 Workshop on Micro and Nanotehenology for Power Generation and Energy Conversion, Power MEMS, Makuhari, Japan, 2003.

Arana, L.R., Baertscb, C.D., Schmidt, R.C., Schmidt M.A., Jensen K.F.,"Combustion-Assisted Hydrogen Production in a High-Temperature Chemical Reactor/Heat Exchanger for Portable Fuel Cell Applications", Transducers '03, Boston 2003.

Koltay, P.,Bohl, B., Taoufik, S., "Dispensing Well Plate (DWP): A Highly Integrated Nanoliter Dispensing System", Transducers '03, Boston 2003.

Nabity, J., Daily, J., "A MEMS Fuel Atomizer for Advanced Engines", CANEUS 2004, Monterey, 2004.

\* cited by examiner

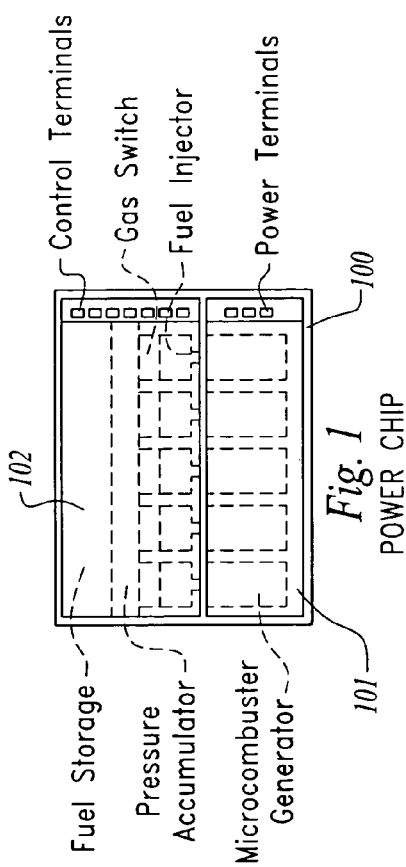
Fig. 1
POWER CHIP
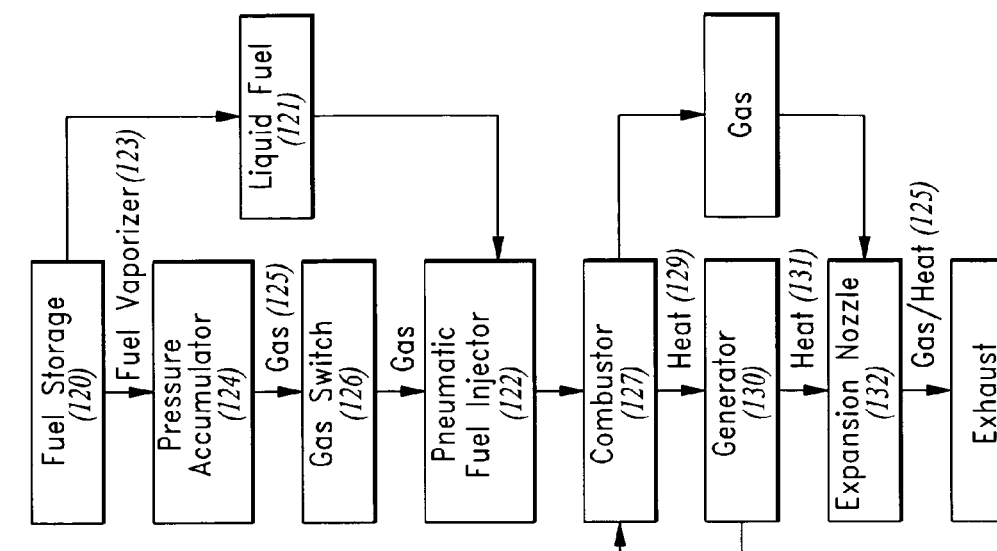
Fig. 2 ENERGY FLOW
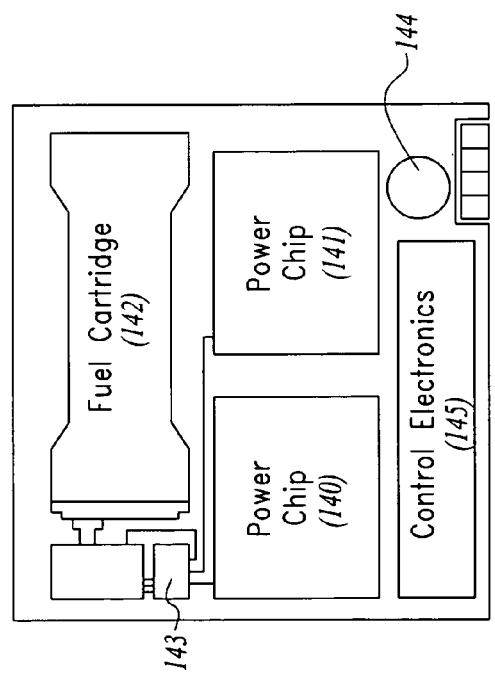
Fig. 3
PORTABLE POWER GENERATOR with REPLACEABLE FUEL CARTRIDGE

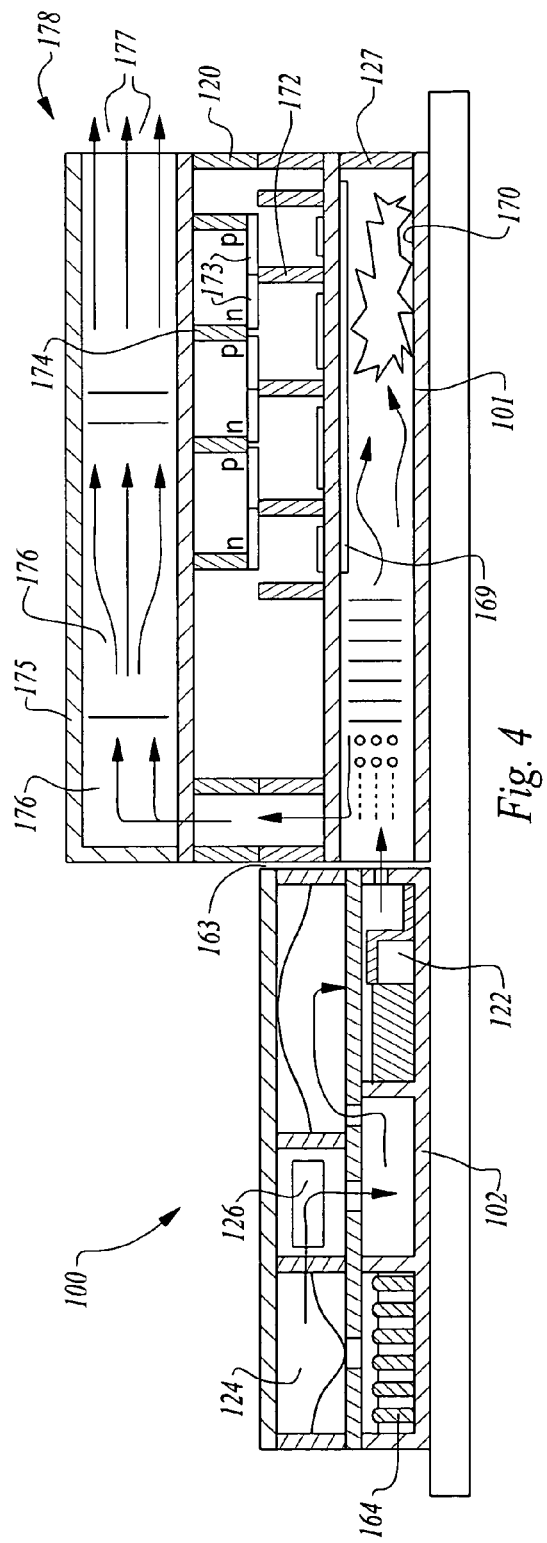
Fig. 4 POWER CHIP (Set)
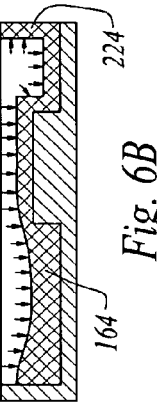
Fig. 6B
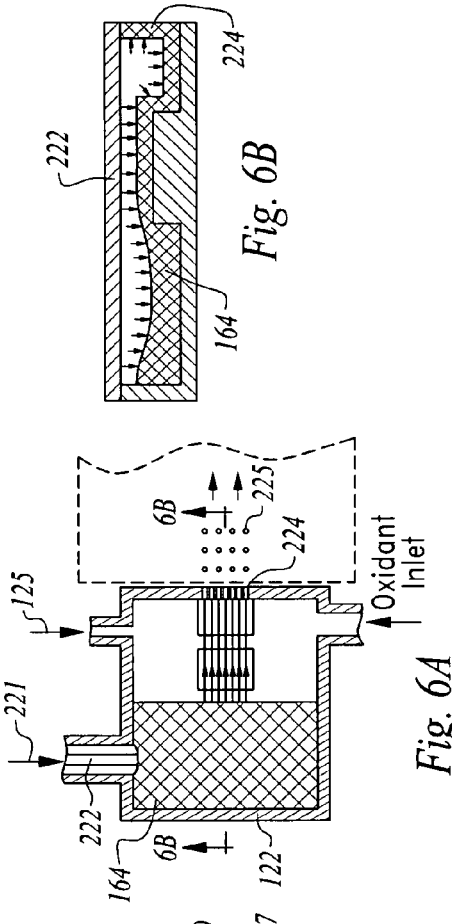
Fig. 6A PNEUMATIC FUEL INJECTOR
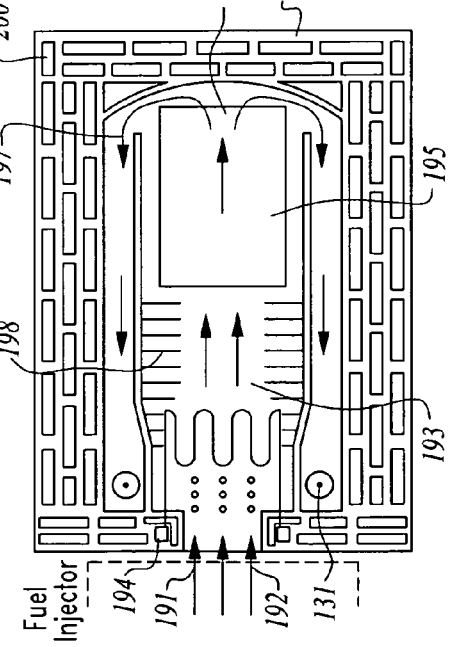
Fig. 5 MICRO COMBUSTOR

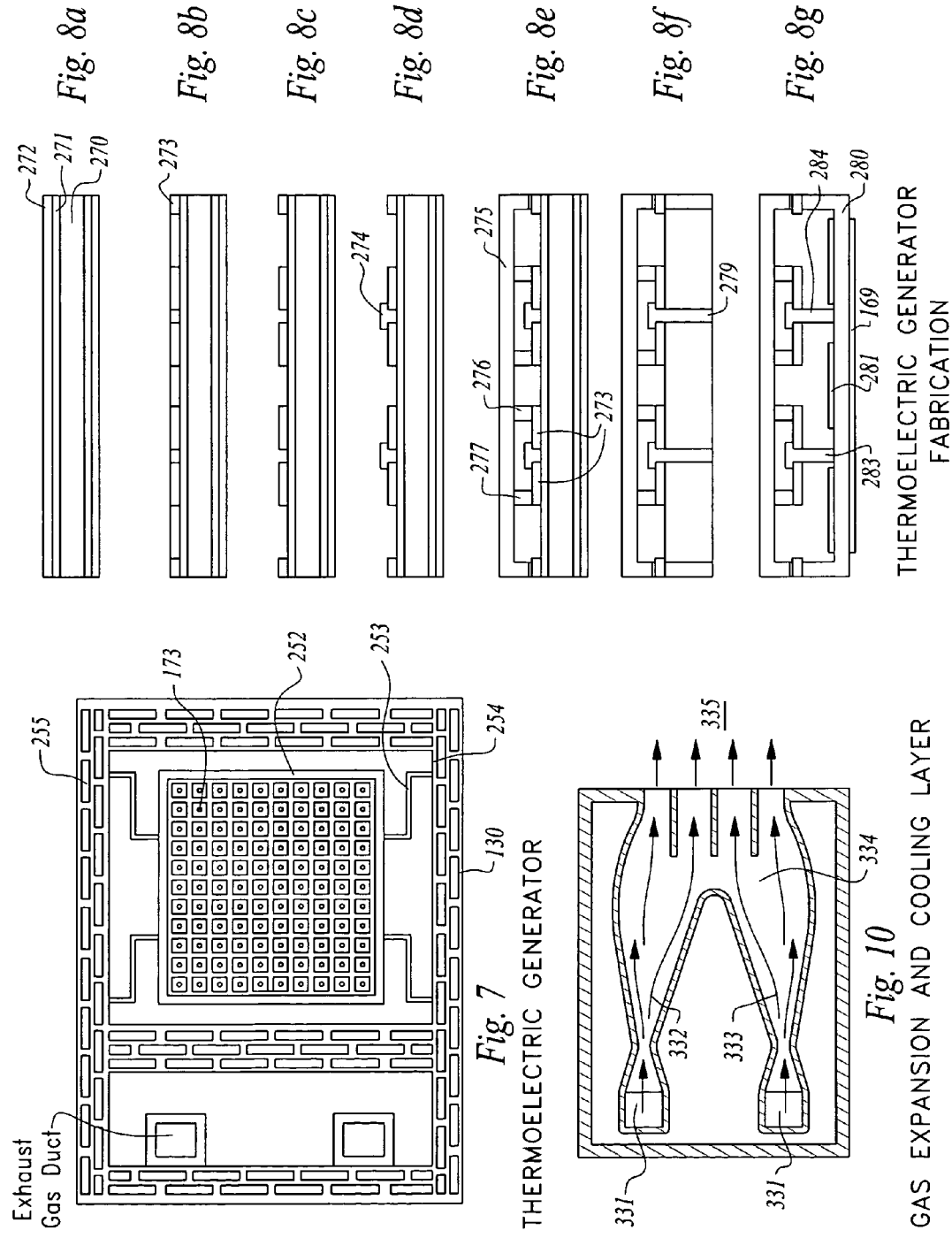

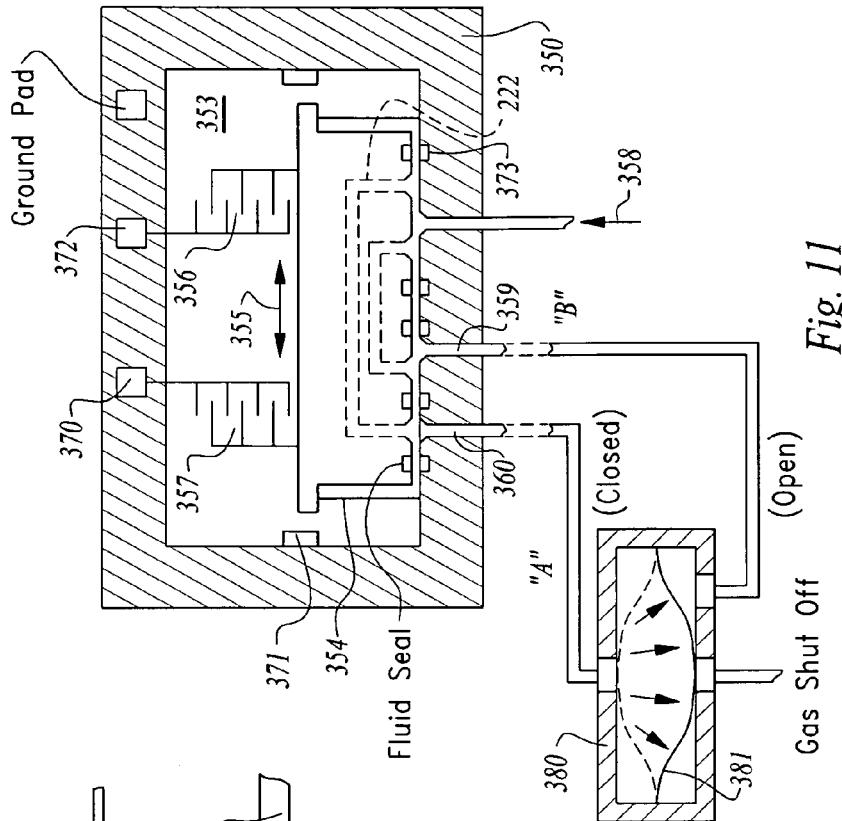
Fig. 11 ELECTROSTATIC GAS SWITCH AND VALVE
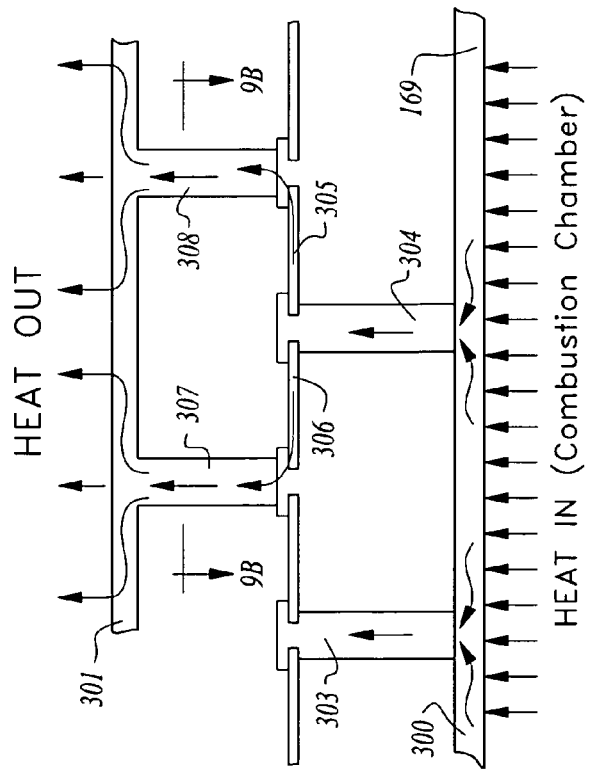
Fig. 9A PNEUMATIC FUEL INJECTOR
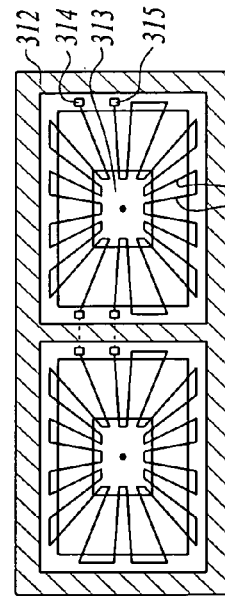
Fig. 9B

ELECTROSTATIC FLUID SWITCH

MICRO-COMBUSTOR with
INTEGRATED FUEL PROCESSOR

ENERGY EFFICIENT MICRO COMBUSTION SYSTEM FOR POWER GENERATION AND FUEL PROCESSING

CROSS REFERENCE TO RELATED PATENT APPLICATION

This patent application claims priority to U.S. provisional patent application Ser. Nos. 60/697,298, titled An Energy Efficient Micro Combustion System For Power Generation and Fuel Processing file on Jul. 8, 2005; and 60/698,903, titled An Energy Efficient Micro Combustion System For Power Generation and Fuel Processing, filed on Jul. 14, 2005.

FIELD OF INVENTION

The field of the invention is generally directed to micro-scale power generation and fuel processing and more specifically, to a micro combustion system comprising a combustor, electric generator or chemical reactor, and fluid and gas handling components. The complete micro system can be optionally integrated into a compact unit for portable electrical power supply.

BACKGROUND

Recent research in micro-power technology has successfully demonstrated technology with ability to control micro-scale combustion of liquid hydrocarbon fuels. Potential applications of the micro combustion technology include new generations of batteries, portable chemical reactors, and micro robots and rovers. For example, see Femandez-Pello A.Carlos "Micro-Power Generation Using Combustion: Issues and Approaches." 29th International Symposium on Combustion Jul. 21-26, 2002 Sapporo, Japan. Given the ability to store substantial amount of power in a compact volume, more applications are expected to impact many fields of technology.

In comparison to current state-of-the-art batteries, liquid hydrocarbon has a significantly higher energy density than the highest-capacity battery today. For example, Li-Ion battery has an energy density of 0.5 MJ/Kg while many hydrocarbon fuels can deliver a specific energy density of 45 MJ/Kg With its extremely high energy density, liquid hydrocarbon is heavily favored as a power source for portable power generators.

Many approaches have been taken to harvest energy generated by combustion from liquid fuel for conversion into electricity. These approaches include producing pressurized gas to actuate a micro turbine and generator, heating a thermoelectric generator, and producing thermal radiation for conversion by a photo-voltaic device. Yet another approach to power generation is by using a fuel cell: the combustion heat provides the energy to break down storable gases (such as ammonia) into hydrogen that is subsequently used by the fuel cell to produce electricity.

The energy production capacities of micro-generators have typically fallen in two broad ranges depending on the size of the system. Micro-scale systems (for example, millimeter sizes) have produced power from micro-to milli-watts, while the meso-scale systems (for example, centimeter sizes) have yielded from tens to hundreds of watts. The manufacturing method and complexity are significantly different between the two types of systems: Micro-scale systems are integrated devices manufactured using silicon processing, while meso-scale devices typically involve complex assemblies of miniature components and involve elements that operate at high speeds, such as micro engines.

In reviewing the demonstrated power of various systems, it is apparent that no micro-scale system is capable of producing power around few watts. A power source producing a few watts of power is of great commercial interest because it meets the requirement for portable electronic products such as cell phones, laptop computers and gaming devices. Several hybrid systems, however, have demonstrated near one watt power by combining micro combustion with commercial thermoelectric modules.

While research in micro combustors has made substantial progress the inventor is not aware of any development to date that reported net positive power generation. Mostly, the electrical power needed for operating accessory equipment such as pumps, valves, and mass flow controller are excluded in the power calculation. To yield a net positive power, it would be necessary to develop ultra-low power systems that include, in addition to a fuel-efficient microcombustor, components needed to sustain stable combustion, handle fuel transport evaporation, mixing flow control, interface sensors and electronics. Currently the efficiency of the conversion rate from heat to electricity remains a major issue, but low-power accessory components are also equally lacking. Other challenges for the developer include system manufacturability, reliability, and of course, cost of fabrication.

Multiple approaches are necessary to achieve net positive power generation. First, rigorous thermal management is needed to ensure that heat generated is directed into an electrical generator with minimum loss to the environment. Second, ultra-low power fluid and gas handling components are needed. Third, an efficient method for integrating the combustor with accessory components is needed. Lastly, although not related to the net power issue, it is vital that the resulting micro system can be produced in high volume and at effective cost.

SUMMARY OF THE INVENTION

The invention provides a method for efficient management of fuel supply and thermal control in a micro-combustor for electrical power generation.

A preferred embodiment of the system uses a combination of passive components and ultra-low power active devices for fluid and gas control. In a preferred embodiment of the invention, the system re-circulates exhaust heat for pre-heating incoming fluid, manages thermal flow with design features that direct heat to flow directly into thermoelectric elements, uses passive capillary force as a means of transporting liquid fuel, uses gaseous pressure generated by fuel vapor to inject and atomize liquid fuel into the combustor, uses electrostatic actuator to deliver pressure pulses for fuel injection and atomization, and expands exhaust gas to cool the cold-end of the thermoelectric generator. In the preferred embodiment, the system can be made of for example, silicon or other materials, and manufactured using semiconductor wafer processing techniques.

Other systems, methods, features and advantages of the invention will be or will become apparent to one with skill in the art upon examination of the following figures and detailed description. It is intended that all such additional systems, methods, features and advantages be included within this description be within the scope of the invention. and be protected by the accompanying claims.

BRIEF DESCRIPTION OF DRAWINGS

The components in the figures are not necessarily to scale, the emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

FIG. 1 illustrates key elements of an example embodiment of the power generation chip, which is also referred to conveniently as a Power Chip. The Power Chip includes two sections for power generation and fuel handling.

FIG. 2 illustrates an example integration of the power generation chip of FIG. 1 with other components needed to provide a complete portable power source to form a portable power generator. The components include a removable fuel cartridge, Power Chips, control electronics and a battery.

FIG. 3 is an energy flow path diagram that illustrates in schematic form the flow of energy through an example power generation chip system.

FIG. 4 illustrates an overview of the components and fuel flow path from injection into a micro-combustor to final exhaust, during operation of an embodiment of the power generation chip system.

FIG. 5 illustrates details of the working mechanism of an example embodiment of the micro-combustor, as well as a gas and energy flow path starting with the fuel and oxidant injected into the micro-combustor through gas exhaust.

FIG. 6A illustrates an example embodiment of a pneumatic fuel injector and atomizer, and more specifically, the working mechanism of an ultra-low power fuel injector that uses pressurized gas to inject and atomize liquid fuel.

FIG. 6B illustrates a cross-sectional view of the pneumatic fuel injector and atomizer of FIG. 6A taken along line A-A.

FIG. 7 shows the top view of an array of thermoelectric elements (thermopile) interconnected and thermally isolated from environment. In an example embodiment of a thermoelectric generator with thermal isolation posts, the gas flow path is also provided to connect the exhaust gas from the combustor to the expansion valve.

FIGS. 8(a) to 8(g) illustrate an example wafer process sequence for fabricating the thermoelectric generator of FIG. 7.

FIG. 9A illustrates another detailed view of the thermoelectric generator of FIG. 7 and shows a detailed view of the thermoelectric element array and its connection to the hot and cold surfaces through integrated posts.

FIG. 9B illustrates a cross-sectional view of the thermoelectric element of FIG. 9A taken along line A-A, shows the arrangement of the positive and negative Seebeck elements to form a thermopile with parallel thermal connections.

FIG. 10 is a diagram of an example gas expansion valve and illustrates the exhaust gas being introduced into the layer for expansion cooling. By passing the heated and pressurized gas through a nozzle, the gas expands and absorbs heat from the nearby environment.

FIG. 11 illustrates an examplar electrostatic gas switch and value designed to switch gas connected to an inlet to any one of the outlet ports. This example switch uses a complementary diaphragm valve to ensure complete gas shutoff.

DETAILED DESCRIPTION OF EMBODIMENTS OF THE INVENTION

Figure 12:
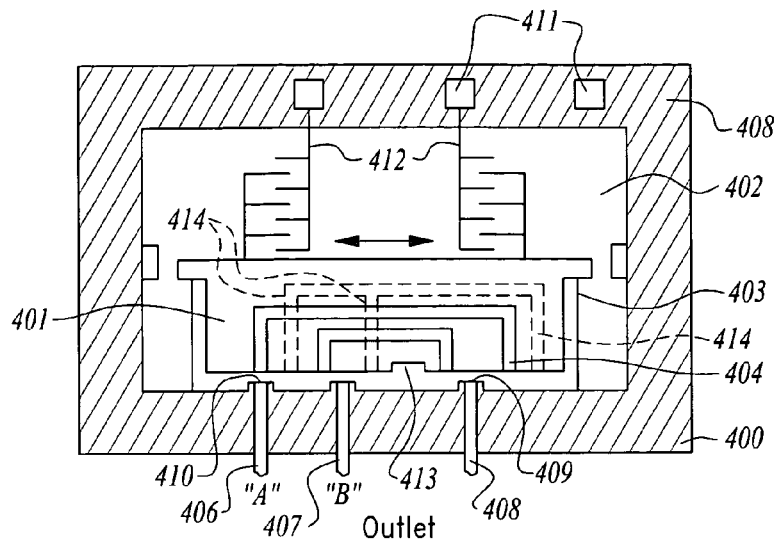
FIG. 12 illustrates an electrostatic fluid switch for switching a fluid connected to an inlet port to any one of the outlet ports.

The invention concerns an energy efficient micro combustion system for electric power generation and fuel processing. This invention enables building small and compact portable power sources and may be used in applications such as batteries, battery chargers and portable chemical reactor for biomedical applications.

Numerous research and development efforts relating to micro combustors have shown the feasibility of a controlled combustion using liquid hydrocarbon fuel. To date, most developments have focused on specific component design such as the combustor or the generator. What remains to be demonstrated, however, is the ability to efficiently harvest combustion energy and convert that energy into useable electricity, while producing sufficient energy needed for operation of accessory components. Micro combustors typically require accessory components such as air pumps, mass flow control valves, fuel valves and monitoring electronics. To successfully achieve positive net power, what is needed is a systematic approach to thermal management, development of efficient combustor and generator elements, fluid and gas control components with extremely low power, and a manufacturing and integration process capable of producing the resulting systems economically and in volume.

The preferred embodiment of the invention approaches the solution to the problems discussed earlier in multiple ways. First, the embodiment attempts to exploit the energy generated by combustion to a maximum. As it is well known to those practicing the art of combustion design, the efficiency of the system is intimately related to the operating temperature and gas inlet and outlet temperatures. Generally, a substantial amount of energy remained in the exhaust gas, which prompted many prior art approaches to re-circulate exhaust gas. The preferred embodiment preferably expands the combusted gas to cool a thermoelectric generator, thereby increasing power generation.

Second, the preferred embodiment of the invention has a design and structure to increase or maximize the heat flow into the thermoelectric generator. The embodiment preferably has integrated features such as thermal posts to conduct heat into and away from thermoelectric elements, and isolate cold and hot surfaces from each other.

Third, the preferred embodiment of the invention uses passive micro-channels and capillary force to transport fuel in the liquid phase until just before entry into the combustor. At the combustor inlet, the fuel is injected and atomized to promote evaporation and mixing with oxidant for combustion. By transporting the fuel in the liquid phase, precision mass flow control is not required and becomes, at most, optional. Instead, adjusting the frequency of the injection allows direct control of the mass flow. The result is a system less sensitive to changes in environment temperature and pressure as compared to a combustion system based on a gas phase fuel that often requires a closed loop control to achieve stability.

Fourth, the preferred embodiment of the invention applies an existing pneumatic liquid dispenser technology for use as a fuel injector and atomizer. By using pressurized gas as the power source for fuel injection, low power electrostatic pressure switches can be used for triggering fuel injection. Possible sources of pressure can be obtained from fuel evaporation or compressed gas in pressurized cartridges.

Fifth, the preferred embodiment of the invention uses electrostatic switches to control the routing of the fluid and gas. Electrostatic components require almost no power to operate since a minute amount of current flows through these components. Several concepts of electrostatic switches for the fluid and gas are disclosed below.

Lastly, the preferred embodiment of the invention integrates all the components needed for power generation, preferably using wafer batch processing technology. In particular, Micro-Electro-Mechanical Systems (MEMS) are a powerful way to produce micro components in volume and low cost. Additional details of the preferred embodiment of the invention are discussed in sections which follow.

An overview description of the improved power generation system is provided. FIG. 1 shows a schematic of the preferred embodiment of the Power Chip 100 system for power generation or power conversion using a micro-combustor. All necessary functions reside in a single chip, or alternatively, for greater manufacturing yield, these functions can be performed by two separate chips. The preferred embodiment is a two-chip arrangement, as it will be shown later: these two sections have different constructions and levels of complexities. The preferred embodiment for the Power Chip consists of two sub-chips: Power Generation chip 101 and Fuel Handling chip 102, both of which are explained in more detail below.

In the preferred embodiment, the Power Generation/chip 101 includes three layers with following components: (i) a micro-combustor for generating heat by combustion of hydrocarbon fuel, (ii) a thermoelectric generator for converting combustion heat into electricity and (iii) an expansion nozzle for expanding the exhaust gas to help remove heat from the cold end of the thermoelectric generator.

In the preferred embodiment, the Fuel Handling chip 102 is made up of two layers with the following components; (i) a fuel reservoir for storage of liquid fuel separate from the fuel cartridge; (ii) a gas pressure accumulator for pressurizing the fuel injector: (iii) a fuel injector and atomizer for evaporating fuel; and (iv) electrostatic switches and valves for fuel transport and generation of pressure pulses.

Each chip in FIG. 1 preferably has an array of five channels. It is expected that multiple channels are required to increase power capacity. For example, if a single channel can produce 0.2 watts, an array of 5 channels would produce 1.0 watts of total power for each chip. A further increase in power can be achieved by using multiple chips.

FIG. 2 illustrates the preferred flow path of fuel through the major compartments in the chips of FIG. 1. Starting from the fuel storage 120, liquid fuel 121 is transported to the pneumatic injector 122, while the pressure generated by the fuel vaporizer 123 is collected in a pressure accumulator 124. The pressurized gas 125 is routed to the gas switch 126 and valve, which drives the pneumatic fuel injector 122. The fuel 121 is atomized by injection through a nozzle in the injector and fed into the combustor 127. Oxidant 128, typically air, is introduced into the combustor, and carried forward by the expansion and flow momentum of the injected fuel.

An external heater provides the power needed to ignite combustion, but its power is turned off immediately after the combustion produces enough heat for self-ignition. Heat 129 from the combustor 127 is conducted into the thermoelectric generator 130 for power generation 134. Residual heat from the exhaust gas 131 is routed into an expansion nozzle 132, and expanded to cool the cold side of the thermoelectric element and further increases the temperature difference in the generator 130. Lastly, the exhaust gas 131 is exhausted out of the expansion nozzle 132.

Other configurations and arrangements are possible to increase or maximize energy usage. For example, it is possible to partially route the exhaust gas to maintain a constant temperature for the pressure accumulator to help maintain a constant pressure level using fuel evaporation.

FIG. 3 illustrates a concept for integrating the Power Chips 100 with other components to form a complete portable power generation source, such as a battery or a battery charger. Depending on the power requirement, multiple Power Chips can be used. A fuel cartridge 142 provides the fuel stored in a container that can be refilled or discarded when the fuel is consumed. The system can be designed with secondary internal reservoirs so that the cartridge may be removed when its fuel is consumed without disrupting battery power delivery. A low-power fuel distribution switch 143 enables connecting fuel only to the desired Power Chip 100: such capability provides a means to conserve fuel by shutting off fuel when demand for power can be supported with a reduced or minimum number of Power Chips.

A battery 144 will be required to provide the small amount of heat necessary to start the combustion, particularly when the temperature is cold, e.g., a cold start. Through sensors and electronic controls, once the combustor reaches a temperature sufficient for self-ignition, the power provided by the battery would be shut off. Additional electronics 145 are expected to control the fuel handler, self-testing, performance and environment monitoring, power management, and reporting of system health status. The fuel cartridge, fuel switch, Power Modules, control electronics, and battery may be integrated, if desired, into electronics 145 and housed in a protective container.

A description of the energy flow in an embodiment of the improved system is provided. A cross sectional diagram of the micro power system with illustration of key elements of design and structure is shown in FIG. 4. Two sub-chips. Power Generation chip 101 and Fuel Handling chip 102, may be combined to form the Power Chip 100. To minimize conductive heat loss, the two chips are separated by a gap 163. It is known that while conductive loss is a significant mechanism near room temperature, convective and radiation losses dominate at higher temperatures, hence, a single contiguous chip may also be adequate. Since micro-systems generally have a large surface area as compared to their volume, the most effective measures to minimize heat loss are using a vacuum to eliminate convective loss and using multiple reflective coating to minimize radiation loss.

The Fuel Handling chip 102 is made up of two tiers, whose functions provide fluid storage, pressurized gas, fluid transport, pressure switching, and fuel injection and atomization. Fuel is introduced into the reservoir 164 by capillary action through micro-channels. Possible liquid hydrocarbon fuels include methanol, butane, ammonia, and propane, gasoline, diesel, kerosene, etc. A system of channels is etched into the wall of the reservoir 164 to retain the liquid fuel. The vapor pressure for the fuel can be very high; for example, butane's vapor pressure at room temperatures is 250 KPa which is sufficient to drive the fuel injector. To ensure that a constant supply of pressurized gas is available for the injector, the reservoir can be heated by an external heater or by hot exhaust gas, and the gas stored in pressure accumulator 124. Closed loop control of the pressure can be achieved by using temperature and pressure sensors built into the wall of the reservoir and closed-loop control electronics.

Alternatively, air can be introduced into a chamber through a one-way diaphragm valve. The heating and cooling of the fuel in the reservoir provides alternating pressure pulses that can be used to pressurize the air. In a micro combustion system, the exhaust gas provides a source for heating, while expanding the exhaust gas through a nozzle provides a source for cooling. Through electronics control and appropriate valves, a pressurized air source can be produced and stored in an accumulator 124.

Next, pressurized gas or air is conducted into a gas switch 126. The switch 126 is operated by electrostatic actuation: gas can be directed into or away from a shut off valve within a short switching time (milli-seconds). The switch does not have to completely be sealed in its states since it is only required to generate pressure pulses. The actual sealing may be accomplished by using a diaphragm valve.

Once pressurized pulses can be generated, they can be used to operate a pneumatic injector 122. The pneumatic injector 122 operates by bringing a small volume of liquid over a nozzle and expelling the fuel out under gas pressure. Such pneumatic injectors have been demonstrated in biomedical liquid dispensing yielding droplets of tens of nano-liters in volume. Previous studies have shown that an ideal fuel droplet size would be near 10 microns in diameter for a worst-case cold start condition. Larger size droplets may be used with less efficiency, and preheating may be required to enhance evaporation before the fuel can be mixed adequately for combustion.

Oxidant, typically air, for combustion is introduced into the combustor (also referred to as combustion chamber herein) 127 by the flow momentum of the injected fuel. As fuel evaporates, the volume expands, thereby drawing in external air. For a more controlled air volume, it is possible to use an electrostatic gas switch and pulse width modulation to control the inlet air volume.

The fuel is injected into the combustion chamber 127 across a small air gap 163. By incorporating different slot geometries, it is possible to increase the airflow resistance, thereby providing a means to affect oxidant flow rate. In addition to having an effect on the oxidant intake, the gap 163 also allows the combustion chamber 127 to be thermally isolated.

The injected fuel and oxidant are mixed and pre-heated in a mixing chamber; followed by entering into the combustion zone. To promote a more complete combustion for higher heat generation or better emission control, a catalyst 169 can be coated on the top surface of the combustion chamber 127. Wherever catalyst 169 is coated is also the hottest region of the combustion zone, and should be in close contact to the thermoelectric generator located above the combustor 127. Directly opposite the catalyst 169, a reflective surface or coating 170 can be applied to help contain thermal radiation.

The combusted product gas is routed to flow in reverse and parallel to the gas inlet direction thus re-circulating heat into the incoming gas, and exits through an outlet located on top of the combustor 127 into the expansion nozzle 176.

In the preferred embodiment, a thermoelectric generator (TEG) 130 is made up of two tiers with a hot wall in contact with the combustor 127 (illustrated below) and a cold wall in thermal contact with the expansion layer (illustrated above). In the first tier. thermal conductive "hot" posts 172 conduct heat from the combustion wall toward thermoelectric elements. To reduce radiation heating of thermoelectric elements, the surface areas not occupied by the thermal posts are coated with low emissivity material. The combustion heat flows from the hot posts 172, through suspended thermal electric elements 173, and into the "cold" posts 174. The cold posts 174 make thermal contact with the cold wall above, and conduct heat to be carried away by the cooled gas.

Directly above the TEG 130 is the gas expansion layer 175. Exhaust gas 131 from combustor 127 passes through nozzle 132, thus expanding the gas volume and absorbing surrounding heat in the process. The cooled gas 177 draws heat from TEG's 130 cold wall and then exits into atmosphere 178.

Other arrangements are possible. For example, to further increase power generation, it is possible to sandwich the combustor 127 on two sides (above and below) with thermoelectric generators and expansion valves. An array and multiple arrays of this same sandwich arrangement are also possible.

An embodiment of the microcombustor is described in greater detail. FIG. 5 illustrates a more detailed diagram of an embodiment of the micro combustor tier 190. Prior development of micro-scale combustors have already demonstrated 5 to 50 watts of reaction heat generated from flowing 2.5 to 25 seem of butane. Key considerations in the design of a combustor include stable and self-sustained combustion, combustion emission and fuel efficiency.

The efficiency of the combustion is dependent on a number of parameters. These parameters include fuel and oxidant ratio, flow rate, residence time and wall temperature. The wall temperature in turn is dependent on thermal management and reactivity of wall surface. Various researchers report ways to enhance combustion through use of catalyst coating, typically platinum, and low well-depth number material to minimize flame quenching. The conversion rate of stochiometric reaction into heat ranges from typically 20% to 80%, to near 100% conversion.

In FIG. 5, atomized fuel 191 and oxidant 192 are injected into the mixing zone 193 of the combustor 127. To promote evaporation of fuel droplets and good mixing with oxidant, heat from an electric heater 194 is used to pre-heat the mixture. The electric heater 194 is also useful when starting the combustor in cold weather. The mixture next moves into the combustion zone 195. A catalyst 169 may be used to promote combustion minimize risk of flame quenching and help lower the self-ignition temperature.

The degree of combustion affects not only the amount of heat generated, but also the emission quality of the exhaust gas. Incomplete combustion not only reduces reaction heat generated, but also increase pollutants released into the atmosphere. To increase combustion efficiency, it is important to increase combustion residence time. This can be achieved, for example, by routing the flow path in a serpentine pattern in the combustion zone.

Finally, combusted product exits in multiple exhaust paths 197 along a direction opposite to the flow, and surrounds the outer wall of the combustion zone 195. Enveloping combustion zone with exhaust gas reduces heat loss, as well as helps to heat up the atomized fuel 191 and oxidant 192. Thermal fins 198 may be used to promote heat transfer from the exhaust gas to the incoming gas. The exhaust gas 131 is routed to outlets into the expansion nozzle located above the combustor 127.

A rigorous thermal management of the combustor 127 is vital to reducing heat loss. In addition to re-circulating exhaust gas the combustor is surrounded by multiple layers of vacuum cavities 200. In addition to eliminating convective loss, the multiple walls of the cavities 200 help reduce radiation loss.

A description of the pneumatic fuel injector in an embodiment of the improved system is provided. An important factor in reducing accessory power is to transport fuel in a liquid form, rather than in a gaseous form. This is important as it allows the use of passive micro channels for fuel transport. Micro-channels are widely used in many applications, particularly in the fluid devices used for biomedical applications. In micro channels capillary force propels liquid in channels very quickly (several meters per second), and in sufficient volume (tens of micro liters per channel).

A combustor transporting fuel in a liquid form provides several benefits. The fuel delivery is passive (requires no power), is not susceptible to temperature and pressure changes, and is immune to shock and vibration. Since the fuel to oxidant ratio is controlled by the fuel injection rate, precise metering (which generally requires closed loop control) of the gas mixture to accommodate temperature changes becomes unnecessary. The main issue with fuel injection is that fuel droplets must be small enough to permit quick evaporation of the fuel in order for the fuel to mix properly with the oxidant and for efficient combustion. Without complete evaporation, impinging of liquid fuel on hot surfaces would cause fouling and poor emission.

Several methods have been developed to inject a liquid into space with very small droplets. A MEMS-based fuel-injector using an electrostatic actuator has demonstrated the feasibility of producing droplets smaller than 50 microns (See Zhang. C., Najafi. K., Bernal. L. P., Washabaugh P. D., "An Integrated Combustor Thermoelectric Micro Power Generator". 11th Conference on Solid State Sensors & Actuators. Jun. 10-14, 2001. Munich, Germany). The main drawback of this particular electrostatic fuel injector is the high voltage (1000V) required to eject droplets, which would require a multi-stage power supply. A pneumatic actuator would be an attractive alternative to the electrostatic injector. Designed for biomedical applications, a MEMS liquid dispenser has demonstrated ejection of nano-liters of liquid, using only small pneumatic pressure (10 KPa). The droplet volume is typically around 50 nanoliters, using a nozzle having a 100-micron diameter. The ideal droplet size for cold start conditions is under 10 microns; however, since the micro combustor does not require cold start condition (auxiliary battery power is available), it is believed that a droplet size larger than 10 microns can be tolerated, and that the pneumatic dispenser can be improved to achieve a desired droplet size.

FIG. 6A illustrates a top view of the pneumatic fuel injector 122. Fuel 121 in liquid form is drawn into the injector by micro channels 222. A pressurized gas 125 is injected in quick successions to force the liquid in the injector nozzle 224 to eject the gas 225. Once emptied, the capillary force quickly refills the nozzle for next cycle. Tests conducted using a pneumatic liquid dispenser showed that two milliseconds are sufficient to eject the droplets, thus hundreds of injections can be made per second, which is sufficient to sustain micro combustion.

The injector nozzle 224 consists of slots etched on the wall of the injector. Inside the injector chamber, micro channels connect the reservoir 164 to the injector nozzle 224. To prevent vapor pressure build-up, occasional venting of the chamber to atmosphere may be required, unless compressed air rather than fuel vapor pressure is used as the source of pressurized gas.

A cross sectional view of the injector of FIG. 6A is shown in FIG. 6B. Fuel reservoir 164 connects to the injector nozzle 224 through micro channels 222. Upon application of a pneumatic pressure, the liquid is forced out of the openings in the injector nozzle 224.

A description of the thermoelectric generator in an embodiment of the improved system is provided. As shown in FIG. 4, directly above the combustor 127 is the Thermoelectric Generator (TEG) 130. Thermoelectric materials have unique properties that enable them to produces a voltage when a temperature gradient is imposed on the material. While the combustor as disclosed can be used in other forms of power generation including thermo-photovoltaic and fuel reforming for feed into fuel cells, the preferred embodiment uses a thermoelectric generator. Thermoelectric materials are characterized by the Seebeck property, and most metal, ceramic, and semiconductor material exhibit this property with different degrees.

FIG. 7 illustrates a top view of an embodiment of the thermoelectric generator (TEG) 130. The TEG 130 includes thermoelectric elements 173 in the form of beams placed on conductive posts. An array of these posts with thermoelectric elements is interconnected and supported on a common material. Since the thermoelectric beams are small, thousands of posts can be placed onto small area. A thermal isolation wall 252 surrounds the array acting as a radiation shield. Thermal conduction of the entire array is also further reduced by connecting the entire array to an external wall with long and thin flexures 253 to the external wall 254, and convective loss is eliminated by evacuating the space 255 between the array and the external wall 254. Lastly, using vacuum cavities further thermally isolates the surrounding wall 254. FIG. 7 also shows the exhaust gas duct opening for the exhaust gas to be routed from the combustor below to the expansion valve above.

FIGS. 8(a) to 8(g) illustrate the steps of an example micromachining method of fabricating the TEG 130. Micro-machining processes are well known in the manufacturing of silicon devices and the like, and include, for example, photolithographic, deposition, doping etching and bonding processes. Several materials are viable for construction of the TEG structure, including silicon and silicon carbide. High thermal conductivity is desirable, since thermal posts require efficient conduction of heat. The process starts as shown in FIG. 8(a) with silicon dioxide 271 and nitride 272 being formed on silicon wafer substrate 270. The silicon dioxide layer 271 will be used as an etch stop, while the nitride 272 is an adhesion promoter and also acts as a hard etch mask. Next, as shown in FIG. 8(b), thermoelectric elements 273 are deposited over the nitride 272. Depending on the thermoelectric material used, different methods are used to obtain positive and negative Seebeck values. For polysilicon, doping with Boron or Phosphorus in concentration level of 10e20 1/cm.sup.3 is adequate for inducing an adequate Seebeck value. Alternatively Bismuth Telluride compounds can be electrodeposited for thermal electric effect. After deposition, the thermoelectric layer is patterned as shown in FIG. 8(c) and an electrical connection 274 is made between the positive and negative elements, as shown in FIG. 8(d). As shown in FIG. 8(e), a cap 275 with its bottom patterned for thermal posts 276-277 is bonded to make thermal contacts with thermoelectric elements 273. The cap is bonded under vacuum to make a seal around the outside edge of the TEG 130. Next as shown in FIG. 8(f), the bonded wafer is turned over and a pattern etched for hot thermal posts 279, followed by removal of oxide and nitride layers. Lastly as shown in FIG. 8(g), a bottom cap 280 with patterned radiation shield 281 and catalysts 169 are bonded to make thermal contact to the lower thermal posts 283-284.

An alternative processing method using Silicon-on-Insulator (SOI) is also feasible. The device layer on the SOI can be doped to enhance thermoelectric property, eliminating the multiple depositions of oxide and polysilicon as discussed previously. Details of fabrication processes using silicon, or with SOI, are familiar to those of ordinary skill in the art of MEMS wafer processing so they will not be repeated here.

A close-up view of an embodiment of the thermoelectric generator is shown in FIG. 9A. The design and structure are arranged to ensure that heat flow is restricted to select paths, which include thermoelectric elements. The thermal gradient across a conductor is proportional to the amount of heat being conducted and the conductor's material and geometry. By ensuring that the maximum amount of combustion heat is passed through thermoelectric elements, the electrical power generated is also maximized. Design tradeoff and formulation for optimum power generation have been reported in the literature and the design tradeoff is well familiar to those of ordinary skill in the art of thermoelectric generator design.

The TEG consists of two exposed surfaces, whose temperatures are referred to as "hot" and "cold" surfaces or walls. Referring to FIG. 9A, the hot wall 300 is thermally connected to the combustor chamber, while the cold wall 301 is connected to a cooled environment. A layer of catalyst 169 is coated on the combustion side of the hot wall 300 to place the hottest temperature in the desired area. An array of thermal posts 276-277 transfers combustion heat from the hot wall 300 to thermoelectric elements 273 suspended between the hot posts 303-304 and cold posts 307-308. Finally, the heat flows out into the cold wall 301 and is dispersed into the cold gas stream.

FIG. 9B illustrates an internal arrangement of an embodiment of the thermoelectric elements. To increase power generation, two different types of thermoelectric elements are used: an element 310 with a positive Seebeck value and another element 311 with a negative Seebeck value. The thermoelectric elements 273 are arranged in pairs, similar to the thermocouples commonly used for temperature measurement. The voltage generated by the thermocouple is proportional to the temperature difference between the two ends. An array of thermoelectric elements (a thermopile) is best used to increase the power generation. In an array, the thermoelectric elements are thermally connected in parallel to the cold end 312 and hot end 313, and electrically in series. The thermoelectric elements terminate at the bond pads 314-315 for external electrical connection. In this configuration, the larger the amount of heat being passed through the thermopile, the larger is the resulting power generated. Optimum configuration depends on a number of parameters, including Seebeck parameters. electrical resistance, and thermal conductivity of the thermoelectric elements.

Expansion cooling in the improved system is described in greater detail. To further increase the thermal gradient across thermoelectric elements, the residual energy in the exhaust gas can be used to cool the cold end 312 of the TEG. Cooling can be achieved by expanding the combustion exhaust gas through a nozzle. FIG. 10 shows a simplified concept of an embodiment of the expansion tier 330.

Gas from the combustor is introduced through the inlets 331. The pressurized gas is passed through nozzles 332-333 to a cooling zone 334 which expands the gas from higher pressure to lower pressure before exiting through gas outlets 335. Consequently, the gas expansion absorbs heat from the environment, including from the wall of the TEG underneath. The design of the expansion nozzle valves 332-333 depends on the type of the gas, pressure, flow rate and temperature. The nozzle design is well known to those of ordinary skill in the art of thermodynamic design.

The electrostatic gas switch and shut-off valve in an embodiment of the improved system is described in greater detail. As discussed earlier, maintaining low power for all aspects of the micro combustion system operation is essential to achieving net positive power. An important component of this system is the gas switch valve that provides pressure pulses for the fuel injector. FIG. 11 shows an illustration of an electrostatic switch 350 for use in an embodiment of the improved system.

Referring to FIG. 11, the switch 350 is constructed of a suspended valve body 351 formed of a material such as silicon, ceramic or an alloy. The preferred embodiment uses silicon, since electrical conductivity makes it easy to integrate a switch 350 into the structure of electrical actuators and sensors. The suspended valve body 351 contains buried and sealed micro channels 222 which can be used to route gases or fluid. The valve body 351 is suspended over a cavity 353 and supported by integrated flexures 354 that are designed to be stiff in one direction and compliant in another direction 355 to allow for valve motion. The position of flexures 354 is arranged such that pressure from the gas is resisted by the flexure 354 in a tensile mode to avoid buckling the flexures 354. Integrated onto the valve body 351 are comb actuators 356-357, which are used for moving the valve body block 351. Other type of actuators may also be used, including those using thermal, magnetic and fluidic forces.

The operation of the switch 350 in FIG. 11 is as follows. Low-pressure gas is connected to the switch 350 through a gas inlet 358. A network of buried micro channels 222 is placed in the valve body 351 to enable connection from the inlet 358 to any gas outlets 359-360. For example, as shown in FIG. 11, the gas from inlet 358 is routed to the gas outlet channel "A" 360. To route the gas into channel "B" 359, the valve body 351 needs to be moved to the right side by applying a voltage to the actuator electrode (1) 370. The attractive force generated by the opposite electric charges attracts the valve body 351 to the right until it is stops against the wall stop 371. Additionally, the comb actuators 357-358 can be used as a position sensor -the movement of the valve body 351 results in a change in the comb distance, leading to a change in capacitance. The change in capacitance can be detected using an appropriate electronic circuit. Returning the valve body 351 to its initial position is achieved by restoring the spring force in the flexures 354, or by actuating the opposite comb actuator (2) 372 for a faster response. The design and operation of comb actuators are well understood by those of ordinary skill in the art of MEMS actuator design.

The primary function of the switch valve 350 is to produce pressure pulses for the fuel injector of an embodiment of the improved system. Since the pulse rate directly affects fuel injection rate the valve switching speed needs to relatively fast, typically under 10 milliseconds (100 Hz minimum). The pressure pulses do not need to exist completely between cycles, since only alternating pulses are of interest. The combustion depends only on droplet size and droplet flow rate, which depends on the pulse frequency. Given a gas under a sufficiently high pressure, a small pressure offset in pressure would not affect fuel injector operation. However, if the gas source has a relatively low pressure, then any leakage or flow obstruction should be eliminated.

Several alternatives are available to seal the switch 350 to reduce pressure leakage. At low gas pressure, a narrow air gap can serve as a seal—an air seal is most effective when applied over long and narrow gaps, such as in a labyrinth or serpentine configuration. For higher pressures, a fluidic switch can be used. For improved sealing capability, micro channels 222 surrounding the gas inlets 358 are etched into the valve body 351 and cavity wall and filled with an appropriate liquid. Alternatively, the valve cavity 353 may also be completely filled with a non-ionic liquid to prevent leakage around the gas passages. For the best sealing result, the switch valve 350 can be combined with a sealed valve. FIG. 11 shows the switch 350 paired with a passive shut-off valve 380 capable of a positive seal. The shut-off valve 380 uses the gas pressure to move a diaphragm 381. Depending on the direction of the gas pressure, the diaphragm 381 can either close or open the gas passage.

The switch valve construction relies on buried channels to conduct gas passage. Buried channels can be made in various ways. One way is by etching trenches into the substrate and covering the substrate by depositing a second layer of material. By designing the proper trench aspect ratio or by orienting the wafer at angles relative to the deposition path, the deposited material would bridge over the trench, leaving a buried channel. Another way to produce a buried channel is by bonding two wafers with etched channels, followed by thinning one wafer to a desired thickness. Yet another way is by starting with a Silicon-on-Insulator (SOI). The device layer of the SOI offers a convenient etch-stop for etching trenches as well as for thinning the handle wafer layer. The design and processing details of forming buried channels are familiar to those of ordinary skill in the art of MEMS technology.

An electrostatic fluid switch for use in an embodiment of the improved system will be described. Another important component needed for a low-power system is a low-power fluid switch. The fluid switch is used to route fuel in a network of micro channels, opening or shutting off fuel to the combustors. The rate of fluid delivery may be controlled. For example, by adjusting the period during which the valve is opened, the amount of fuel can be controlled. The use of pulse-width modulation is a common technique for controlling the duty cycle of a device. The fluid switch working in conjunction with a fuel injector provides a means for optimizing the performance of the micro combustor system.

The preferred embodiment for a fluid switch is a device that employs micro channels and electrostatic actuation for channel switching. The fluid switch valve has a construction very similar to the gas switch valve discussed earlier. The main difference between the two is that the micro channels for the gas valve are sealed, while the channels for the fluid switch may remain opened. The fluid in micro channels is retained by surface tension and driven by capillary force.

FIG. 12 shows an example concept for an electrostatic actuated fluid switch 400, which may be used in an embodiment of the improved system. A valve body 401 is suspended over a cavity 402 and supported by flexures 403. The flexure 403 is designed to be compliant in one direction and stiff in other directions. A network of micro channels 404 is disposed on the valve body 401 such that depending on the position of the valve body 401, a continuous passage is made from an inlet 405 to any outlet 406-407. Multiple channels can also be combined in a network such that an inlet 414 is connected to multiple outlets 415. Fluid is connected to the chamber wall through micro channels 405-407 disposed on the substrate 408. The valve body 401 and chamber substrate 408 is fabricated such that small gaps 409-410 exist between the chamber wall and the valve body 401.

The switch 400 of FIG. 12 operates as follows. A voltage is applied to electrostatic comb actuators 412 to move the valve body 401. When the valve body 401 is positioned such that two micro channels are aligned (e.g., micro channel outlet 415 and outlet "B" 407), surface tension would enable the fluid to "jump" and form a bridge across the air gap 409. Once connected the capillary force in micro channels would draw the fluid in and fill the micro channels. The valve body 401 is integrated with the electrostatic comb drives 412, thus allowing the valve body 401 to be moved by applying an electrical potential across the terminals or wire bonding pads 411. To ensure that fluid will not be drawn into the space between the valve body 401 and the chamber walls, the immediate area surrounding the inlets 414 (top, bottom and sides) are widened to relieve capillary force. Using a widening gap 413 to stop fluid flow has been applied successfully in preventing undesired flow into the micro channels.

The fluid switch 400 can be made from various materials, including silicon, ceramics, glass, metal, or alloys. Selection of the material will depend on the surface tension characteristic of the material and detailed micro channel design. The surface tension characteristic of a material may also be modified by surface treatment or coatings. Material should also be selected for ease of integration of the switch 400 with the actuators 412 for driving as well as for sensing functions. In a preferred embodiment, the switch 400 would be fabricated from silicon since all of the functions described have been previously been observed using silicon devices.

A micro combustor with an integrated fuel processor for use in an embodiment of the improved system is described. The heat generated by micro combustion may be used to produce electrical power directly through thermoelectric and thermo-photovoltaic, and it may also be used to promote chemical reactions for production of useful products such as hydrogen generating power by a fuel cell.

Figure 13:
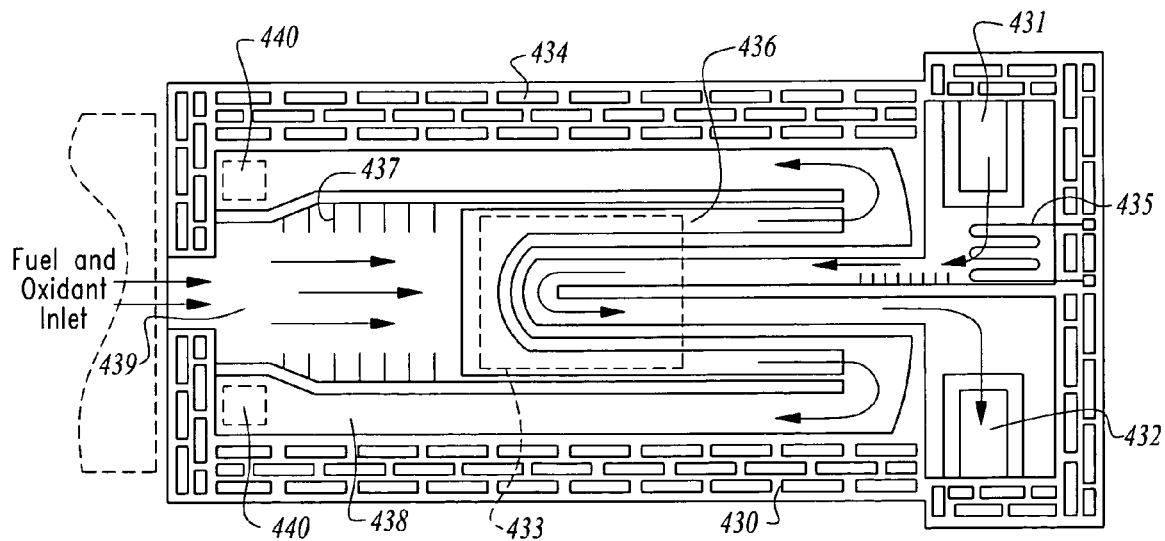
FIG. 13 illustrates an example embodiment of a micro-combustor with an integrated fuel processor, where the micro combustor is integrated with a separate flow path for forming a reaction chamber at the combustion zone.

FIG. 13 illustrates a micro combustor combined with a fuel processor 430 for an embodiment of the improved system. The fuel processor 430 provides a flow path that allows introduction of a gas from an inlet to a section where heat from combustion may be conducted into the gas, thus promoting the chemical reaction process. Processor gas is introduced into the inlet 431 and exits from outlet 432 after completion of the reaction. A flow path between the inlet 431 and outlet 432 coincides with the hottest region 433 of the combustor path. As heat is conducted across from the combustor side into the processor side, this heat provides the energy required for breaking down the processor gas into desirable constituents. Typical gases that are reacted to product hydrogen include ammonia and methanol steam.

The integrated combustor and fuel processor allows for an efficient transfer of heat from an exothermic reaction to help promote an endothermic reaction. By bringing both processes together under a compact and controlled environment, the portable fuel processor generates hydrogen on demand, using an easily stored fuel such as ammonia.

Thermal management is again an important factor in the design of the integrated combustor and fuel processor. A low thermal conductivity material may be used, such as oxide and nitride. However, among the three types of heat loss mechanism, conduction, convection and radiation, the dominant mode of heat transfer is dependent on the temperature. At high temperatures (above 500 degrees Celsius), convection and radiation dominate, while the conductive loss is a small contributor. To reduce convective loss. vacuum cavities 434, are placed throughout the outer perimeter of the unit. Multiple cavities 434 with its reflective walls also help to reduce thermal radiation loss. Above and below the unit, reflective coating may be applied to contain thermal radiation.

As in a combustor, a heater 435 at the inlet 431 of the processor gas helps to heat up the gas to be processed. Once the temperature reaches a self-sustaining point, the heater 435 can be turned off Alternatively, the processor gas may be sequenced to start only after the combustor reaches a desired temperature. In the combustion zone, a catalyst 436 can be placed above and below the flow path to promote combustion efficiency. Thermal recirculation is again important: exhaust processor gas can be used to warm up the incoming gas, thermal fins 437 are used to help conduct heat from the exhaust gas 438 to the incoming gas 439, before exiting outlets 440.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. For example, this invention is particularly suited for applications involving micro power generation, but can be used on any design involving microcombustion, micro chemical processing, or micro fluidic control. As a further example, each feature of one embodiment can be mixed and matched with other features shown in other embodiments. Features and processes known to those of ordinary skill in the art of power generation design and/or processing may similarly be incorporated as desired. Additionally and obviously, features may be added or subtracted as desired. Accordingly the invention is not to be restricted except in light of the attached claims and their equivalents.

REFERENCES

1. Fernandez-Pello, A. Carlos. Micro-Power Generation Using Combustion: Issues and Approaches. 29th International Symposium on Combustion, 7/21-7/26, 2002. Sapporo. Japan.
2. Cohen, A. L. et al, U.S. Pat. No. 6,613,972
3. Masel. R. I. et al, U.S. Pat. No. 6,193,501
4. Gardner, T. J. et al. U.S. Pat. No. 6,786,716
5. Arana. R. A, et al, U.S. Patent Application 20030027022
6. Perlo. P. et al, U.S. Patent Application 20040079301
7. Strasser, M., Aigner, R., Lauterbach, C., Sturn, T. F., Franoseh, M., Wachutka, G., "Micromachined CMOS Thermoelectric Generators As On-Chip Power Supply". Transducers '03. June 8-12. Boston.
8. Shaevitz S. B., Franz, A. F., Klavs, F. I., Schmidt M. A., "A Combustion-Based MEMS Thermoelectric Power Generator", Transducers '01. June 10-14. Munich.
9. Zhang, C., Najafi, K., Bernal, L. P., Washabaugh, P. D., "An Integrated Combustor Thermoelectric Micro Power Generator", 11th Conference on Solid State Sensors & Actuators. Jun. 10-14, 2001. Munich, Germany.
10. Yoshida, K., Kobayashi, K, Nakajima, T., Satoh, D., Tanaka, 5, Esashi, M., "Micro-Thermoelectric Generator Using Catalytic Combustor". Power MEMS 2002. Japan.
11. Chant K. S., Tanaka S., Chang, C. L. Esashi. M., "Combustion Integrated Micro-Fuel Processor with Suspended Membrane Structure". Transducers '03. June 8-12. Boston.
12. Wijngaards. D. D. L., Kong, S. H. Bartek, M., Wolifenbuttel. F., "Design and Fabrication of on-Chip Integrated PolySiGe and PolySi Peltier Devices." Sensors and Actuators, Vol 85, 2000.
13. Vican., J. Gajdeczko. B. F. Dryer. F. L. Milius, D. L., Aksay. I. A., Yetter. R. A., "Development of a Microreator as a Thermal Source for MEMS Power Generation", 29th International Symposium on Combustion. Jul. 21-26, 2002. Sapporo. Japan.
14. Shannon, M., Moore G. V., Ganley 3., Miesse, C, Rice C., Seebauer, E. G., Masel RI, "High-Temperature Microcombustor-Based Ammonia Microehemical Hydrogen Generator Reactors for PEM Fuel Cells". Solid-State Sensors, Actuator and Microsystems Workshop. Hilton Head. 2002.
15. Nielsen, O. M. Arana. R. A., Baestsch, C. D., Jensen, K. F., Schmidt. M. A., "A Thermophotovoltaic Micro-Generator for Portable Power Applications". Transducers '03. Boston. 2003.
16. Norton, D. G., Voit. K. W., Cruggemann, T., Viachos. D. G., Wetzel. E. D., "Portable Power Generation Via Integrated Catalytic Microcombustion-Thermoelectric Device." 2004.
17. Sitzki. L., Borer. K., Shuster. B., Ronney. P., Wussow. S. "Combustion in Microscale Heat-Recirculating Burners". 3rd Asia-Pacific Conference on Combustion. Seoul. Korea. 2001.
18. Suzuki. Y., Horii, Y., Kasagi, N., "Micro Catalytic Combustor with Tailored Pt/A1203 Films". 3 Workshop on Micro and Nanotehenology for Power Generation and Energy Conversion, Power MEMS, Makuhari. Japan, 2003.
19. Arana L. R., Baertscb, C. D., Schmidt, R. C., Schmidt M. A., Jensen K. F., "Combustion-Assisted Hydrogen Production in a High-Temperature Chemical Reactor/Heat Exchanger for Portable Fuel Cell Applications". Transducers '03. Boston 2003.
20. Koltay. P., Bohl, B., Taoufik. S., "Dispensing Well Plate (DWP): A Highly Integrated Nanoliter Dispensing System", Transducers '03. Boston 2003.
21. Nabity. J., Daily. J., "A MEMS Fuel Atomizer for Advanced Engines". CANEUS 2004. Monterey. 2004.

I claim:
1. A micro-scale system comprising:
a fuel handling chip fabricated using a semiconductor wafer processing technique;
a power generation chip comprising a combustion chamber, fabricated on a substrate using a semiconductor wafer processing technique;
a thermoelectric generator element having a hot end and a cold end deposited and fabricated on the substrate using a semiconductor wafer processing technique;
the power generation chip configured whereby a combusted product gas exiting through an outlet located on top of the combustion chamber is routed to flow in reverse and parallel to a fuel inlet direction into an expansion nozzle.
2. The micro-scale system of claim 1 wherein the fuel handling chip and the power generation chip are thermally isolated from each other.
3. The micro-scale system of claim 1 wherein the fuel handling chip uses a fuel capillary force and a pressurized gas to control a fuel flow rate to a fuel injector nozzle.
4. The micro-scale system of claim wherein the hydrocarbon fuel flow rate through the nozzle is controlled by an electrostatic actuated fluid switch.
5. The micro-scale system of claim 1, wherein a capillary force is used to transport fuel from a fuel source to the power generation chip.

* * * * *